United States Patent
Ho

(10) Patent No.: US 9,166,128 B2
(45) Date of Patent: Oct. 20, 2015

(54) LIGHT-EMITTING ASSEMBLY AND METHOD FOR MANUFACTURING THE SAME

(71) Applicant: LEXTAR ELECTRONICS CORPORATION, Hsinchu (TW)

(72) Inventor: Yei-How Ho, Miaoli County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/251,534

(22) Filed: Apr. 11, 2014

(65) Prior Publication Data

US 2015/0060914 A1    Mar. 5, 2015

(30) Foreign Application Priority Data

Sep. 2, 2013    (TW) .............................. 102131492 A

(51) Int. Cl.
*H01L 21/00* (2006.01)
*H01L 33/58* (2010.01)
*F21V 5/04* (2006.01)
*H01L 33/60* (2010.01)
*H01L 33/00* (2010.01)

(52) U.S. Cl.
CPC . *H01L 33/58* (2013.01); *F21V 5/04* (2013.01); *H01L 33/0095* (2013.01); *H01L 33/60* (2013.01)

(58) Field of Classification Search
CPC ....... H01L 33/005; H01L 33/52; H01L 33/54; H01L 22/58; H01L 22/60; H01L 22/0095
USPC .................... 438/24, 27, 29, 65, 72
See application file for complete search history.

(56) References Cited

U.S. PATENT DOCUMENTS

2014/0021491 A1*    1/2014    Meng et al. ..................... 257/82

* cited by examiner

*Primary Examiner* — Kevin M Picardat

(57) ABSTRACT

A light-emitting assembly and a method for manufacturing the same are provided. The light-emitting assembly includes a circuit board with a light-emitting element and a plurality of optical microstructures disposed thereon. The optical microstructures adjacent to the light-emitting element absorb or guide a portion of light emitted from the light-emitting element.

10 Claims, 4 Drawing Sheets

LIGHT-EMITTING ASSEMBLY AND METHOD FOR MANUFACTURING THE SAME

CROSS REFERENCE TO RELATED APPLICATIONS

The present application claims priority of Taiwan Patent Application No. 102131492, filed on Sep. 2, 2013, the entirety of which is incorporated by reference herein.

BACKGROUND OF THE INVENTION

1. Field of the Invention

The present application relates to a light-emitting assembly, and in particular to a light-emitting assembly having optical microstructures and a method for manufacturing the same.

2. Description of the Related Art

Referring to FIG. 1, a conventional direct-type backlight module 10 includes a circuit board 10a with at least a light-emitting element 10b disposed thereon. It should be noted that a portion of light emitted from the light-emitting element 10b is reflected by the circuit board 10a, as the arrow shows in FIG. 1, and then leaves the backlight module 10. However, the light projecting on the circuit board 10a is not uniformly distributed, thus adversely affecting the illumination uniformity of the direct-type backlight module 10.

BRIEF SUMMARY OF THE INVENTION

In view of the aforementioned known problems, an embodiment of the invention provides a light-emitting assembly comprising a circuit board, a light-emitting element, and a number of optical microstructures. The light-emitting element is disposed on the circuit board. The optical microstructures are disposed on the circuit board and adjacent to the light-emitting element, and thus a portion of light emitted from the light-emitting element can be absorbed or guided by the optical microstructures.

Another embodiment of the invention also provides a method for manufacturing the light-emitting assembly, comprising: providing a circuit board; forming a number of optical microstructures on the circuit board; and providing a light-emitting element on the circuit board, wherein the optical microstructures are adjacent to the light-emitting element.

The invention disposes the optical microstructures on the circuit board and arranges the optical microstructures in a region where the light emitted from the light-emitting element is predicted to have a higher density and form a bright band. Accordingly, a portion of light emitted from the light-emitting element can be absorbed or guided by the optical microstructures, thus improving the illumination uniformity of the light-emitting assembly.

Moreover, the invention utilizes a screen printing method to form the optical microstructures on the circuit board. There is therefore no need to use additional optics to improve the conventional problems, and production cost can also be efficiently reduced.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
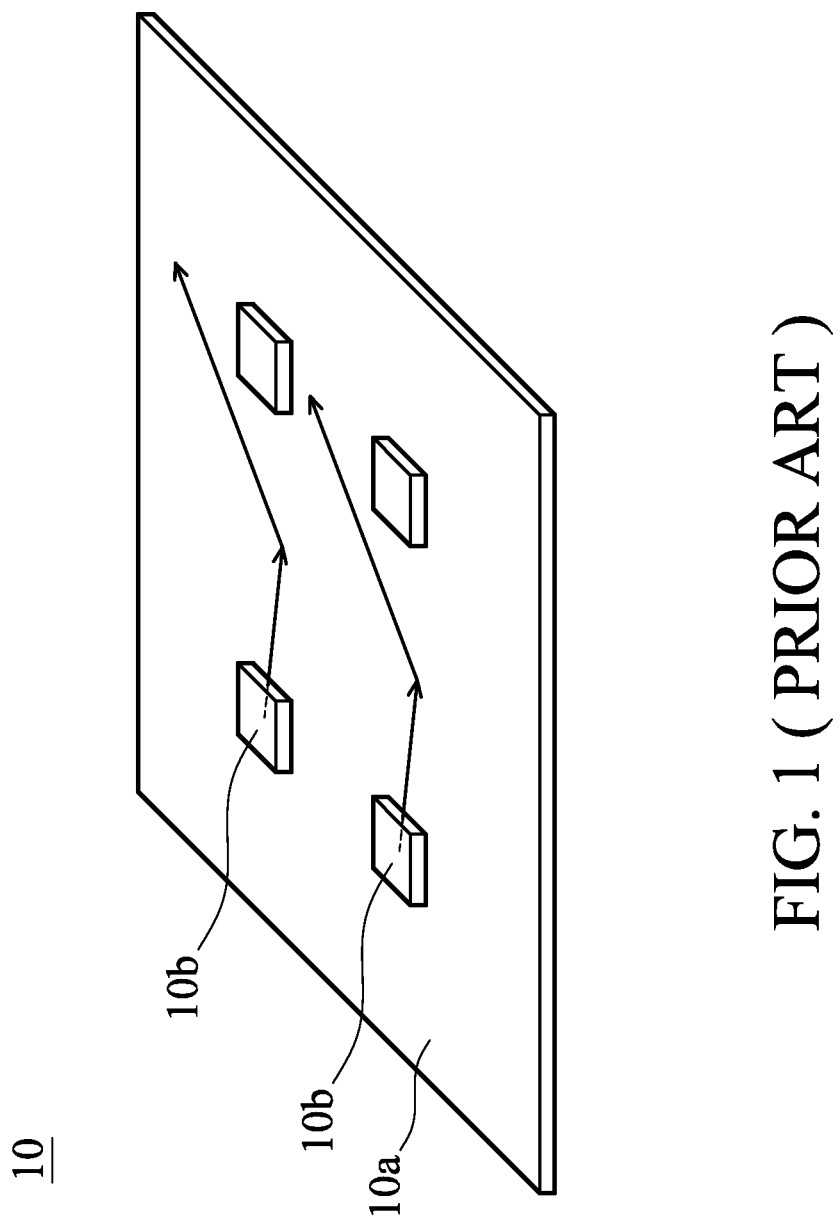
FIG. 1 is a schematic diagram of a conventional direct-type backlight module, wherein the light-emitting elements thereof project light on a circuit board.
Figure 2A:
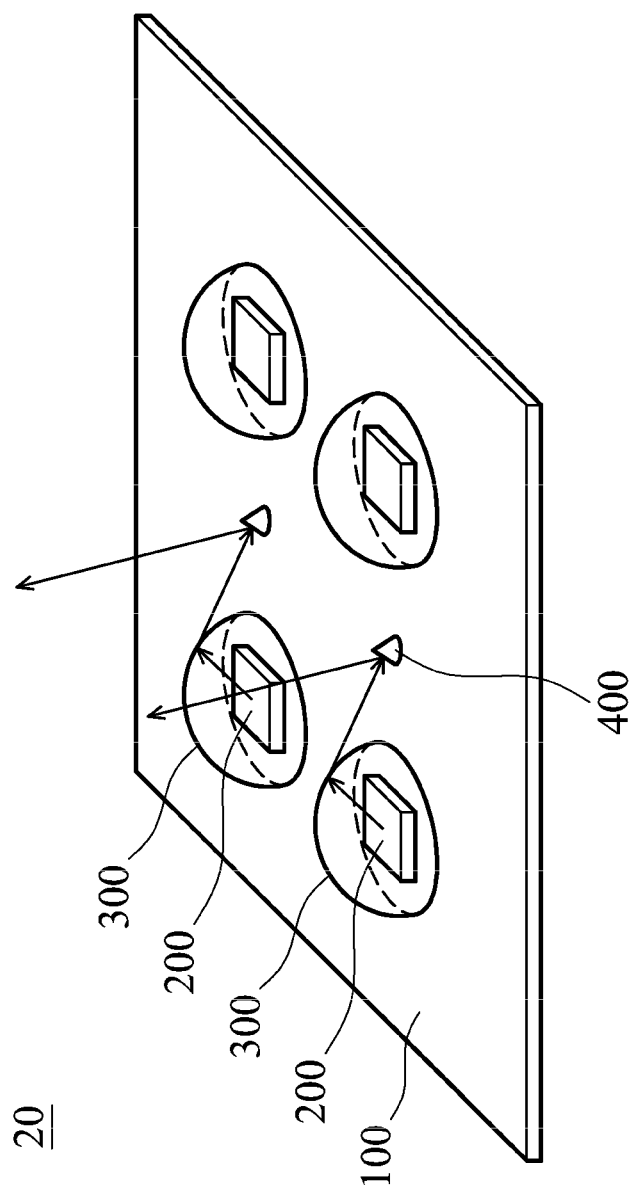
FIG. 2A is a schematic diagram of a light-emitting assembly according to an embodiment of the invention.

Referring to FIG. 2A, a light-emitting assembly 20 according to an embodiment of the invention, such as a direct-type backlight module, may be applied to a liquid-crystal display. The light-emitting assembly 20 includes a circuit board 100 with at least a light-emitting element 200, at least a lens 300, and a number of optical microstructures 400 disposed thereon. Each of the light-emitting elements 200 may comprise a light-emitting diode (LED) package. The lens 300 covers the light-emitting element 200.

It should be noted that a portion of light emitted from the light-emitting element 200 directly passes through the lens 300 and exits the light-emitting assembly 20 (not shown in FIG. 2A). Another portion of light emitted from the light-emitting element 200 is refracted by the lens 300 to a surface of the circuit board 100, as the arrows shown in FIG. 2A, and then reflected by the circuit board 100 to exit the light-emitting assembly 20. In some embodiments, the lens 300 can be omitted, and a portion of light emitted from the light-emitting element 200 directly projects on the surface of the circuit board 100.

Since the light projecting on the surface of the circuit board 100 is not uniformly distributed, the illumination uniformity of the light-emitting assembly 20 may be reduced, thus causing an image of a liquid-crystal display to have bright and dark bands. For this reason, in this embodiment, the optical microstructures 400 are disposed on the circuit board 100 where the light emitted from the light-emitting element 200 has higher density and forms the bright bands, thus non-uniform illumination of the light-emitting element 20 can be prevented.

In this embodiment, the optical microstructures 400 may comprise light-absorbing or light-reflecting material. As the optical microstructures 400 comprise light-absorbing material, they can absorb a portion of light projected on the surface of the circuit board 100. As the optical microstructures 400 comprise light-reflecting material, they can guide a portion of light to some regions that need to be brighter. Accordingly, the illumination uniformity of the light-emitting assembly 20 can be improved.

Figure 2B:
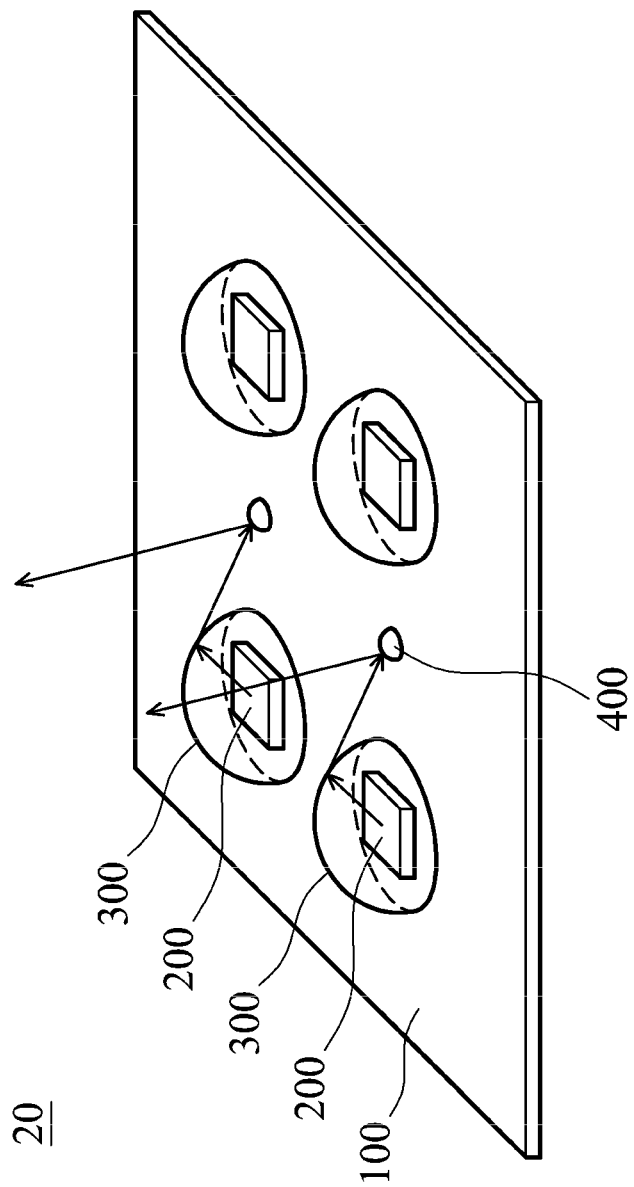
FIG. 2B is a schematic diagram of a light-emitting assembly according to another embodiment of the invention.

In some embodiments, the optical microstructures 400 may have a cone (as shown in FIG. 2A) or hemisphere shape (as shown in FIG. 2B).

Another embodiment of the invention also provides a method for manufacturing the light-emitting assembly 20. The first step is to provide a circuit board 100. Then, a number of optical microstructures 400 are formed on the circuit board 100, and at least a light-emitting element 200, such as a light-emitting diode (LED) package, is provided on the circuit board 100. Specifically, the optical microstructures 400 are situated near the light-emitting element 200. It is noted that the optical microstructures 400 are actually formed in the regions where the light emitted from the light-emitting element 200 has higher density and forms bright bands. In addition, the regions can be predicted by the predetermined location of the light-emitting element 200.

In some embodiments, the method for manufacturing the light-emitting assembly 20 may further comprises a step, in which at least a lens 300 is provided to cover the light-emitting element 200.

Figure 3:
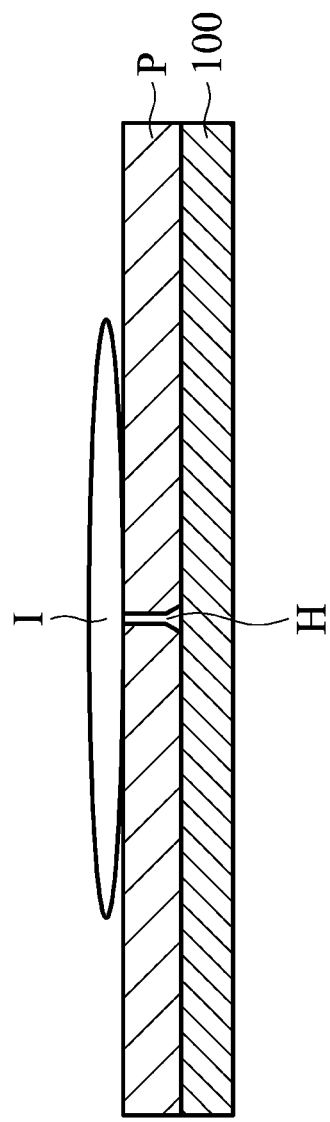
FIG. 3 is a schematic diagram that shows an optical microstructure formed on the circuit board by a screen component and ink.

Referring to FIG. 2A and FIG. 3, the method for forming the optical microstructures 400 further comprises the steps as follows. Firstly, a screen component P is provided, and the screen component P includes a number of openings H with their locations and shapes corresponding to the optical microstructures 400 (FIG. 3 only shows a cone-shaped opening H for illustration). Next, an ink I is provided, and the ink I is disposed on the circuit board 100 through the openings H of the screen component P to form a number of ink microstructures. Subsequently, the ink microstructures are cured and solidified to form the plurality of optical microstructures 400 on the circuit board 100, as shown in FIG. 2A.

It should be noted that the ink I may comprise silica gel, acrylic, epoxy resin, or a combination thereof. In addition, the ink I may comprise light-absorbing or light-reflecting material. For example, the ink I may be black ink capable of light absorption, wherein the black ink comprises black additive, having carbon black and/or black organic dye and/or black mineral dye. Alternatively, the ink I may be white or silver ink capable of light reflection, wherein the color additive of the white or silver ink comprises high reflective oxide, having titanium dioxide, and/or high reflective metal, such as silver or aluminum.

As mentioned above, the invention provides a light-emitting assembly and a manufacturing method thereof. By disposing a number of optical microstructures on a circuit board of the light-emitting assembly, a portion of light emitted from a light-emitting element can be absorbed or guided, thus improving the illumination uniformity of the light-emitting assembly. Specifically, the invention utilizes a screen printing method to form the optical microstructures on the circuit board. There is therefore no need to use additional optics to improve the conventional problems, and production cost can also be efficiently reduced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a light-emitting assembly, comprising:
   providing a circuit board;
   forming a plurality of optical microstructures on the circuit board; and
   providing a light-emitting element on the circuit board, wherein the optical microstructures are adjacent to the light-emitting element for absorbing or guiding a portion of light emitted from the light-emitting element, and the optical microstructures are made from an ink comprising light-absorbing or light reflecting material.

2. The method for manufacturing a light-emitting assembly as claimed in claim 1, wherein the steps of forming the optical microstructures comprise:
   providing a screen component;
   providing the ink, and disposing the ink on the circuit board through the screen component to form a plurality of ink microstructures; and
   curing the ink microstructures to form the plurality of solid optical microstructures on the circuit board.

3. The method for manufacturing a light-emitting assembly as claimed in claim 2, wherein the optical microstructures are formed in a region where the light emitted from the light-emitting element is predicted to have a higher density and form a bright band.

4. The method for manufacturing a light-emitting assembly as claimed in claim 1, wherein the ink comprises silica gel, acrylic, epoxy resin, or a combination thereof.

5. The method for manufacturing a light-emitting assembly as claimed in claim 1, wherein the light-absorbing material comprises organic or mineral dye.

6. The method for manufacturing a light-emitting assembly as claimed in claim 5, wherein the light-absorbing material comprises carbon black and/or black mineral dye.

7. The method for manufacturing a light-emitting assembly as claimed in claim 1, wherein the light-reflecting material comprises high reflective oxide and/or high reflective metal.

8. The method for manufacturing a light-emitting assembly as claimed in claim 7, wherein the light-reflecting materials comprise titanium dioxide, aluminum, and/or silver.

9. The method for manufacturing a light-emitting assembly as claimed in claim 1, wherein the light-emitting element comprises an LED.

10. The method for manufacturing a light-emitting assembly as claimed in claim 9, further comprising:
    providing a lens covering the light-emitting element.

* * * * *